(12) United States Patent
Lee et al.

(10) Patent No.: US 9,851,410 B2
(45) Date of Patent: Dec. 26, 2017

(54) TECHNIQUES TO PROVIDE A LOW CAPACITY NOTIFICATION FOR AN ENERGY STORE DEVICE

(71) Applicant: Landis+Gyr Innovations, Inc., Alpharetta, GA (US)

(72) Inventors: Tou Lee, Apharetta, GA (US); Raghav Goteti, Atlanta, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 250 days.

(21) Appl. No.: 14/551,433

(22) Filed: Nov. 24, 2014

(65) Prior Publication Data
US 2016/0146892 A1    May 26, 2016

(51) Int. Cl.
*G01R 31/36* (2006.01)
*G01R 21/133* (2006.01)

(52) U.S. Cl.
CPC ......... *G01R 31/362* (2013.01); *G01R 21/133* (2013.01); *G01R 31/3606* (2013.01)

(58) Field of Classification Search
CPC ............ G01R 31/3648; G01R 31/3624; G01R 31/3675; G01R 31/3651; Y02E 60/12
USPC .......................................................... 324/427
See application file for complete search history.

(56) References Cited

U.S. PATENT DOCUMENTS

| 4,413,221 A | * | 11/1983 | Benjamin | .......... | G01R 31/3631 |
| | | | | | 320/129 |
| 5,818,333 A | * | 10/1998 | Yaffe | ................ | G01R 19/16542 |
| | | | | | 324/433 |
| 6,490,257 B1 | | 12/2002 | Watanabe et al. | | |
| 8,947,050 B2 | * | 2/2015 | Gale | ...................... | H02J 7/0077 |
| | | | | | 320/132 |
| 9,429,627 B2 | * | 8/2016 | Lee | ........................ | H02J 7/0063 |
| 9,680,327 B2 | * | 6/2017 | Scheb | ..................... | H02J 7/025 |

(Continued)

FOREIGN PATENT DOCUMENTS

| WO | 2007079490 | 7/2007 |
| WO | 2016003552 | 1/2016 |
| WO | 2016085685 | 6/2016 |

OTHER PUBLICATIONS

PCT/US2015/060782, "International Search Report and Written Opinion", dated Mar. 17, 2016, 11 pages.

(Continued)

*Primary Examiner* — Jermele M Hollington
(74) *Attorney, Agent, or Firm* — Kilpatrick Townsend & Stockton LLP (57) ABSTRACT

Disclosed are various systems and methods related to forecasting a low capacity state in an energy storage device of a node. A voltage is measured for the energy storage device of the node based upon measurement criteria. A counter for the node is adjusted based on the measured voltage, where the counter represents a history of instances of previous measurements of the voltage with respect to a voltage limit. The counter is adjusted in one direction if the measured voltage is below the voltage limit, and the counter is adjusted in the opposite direction if the measured voltage meets the voltage limit. If the counter meets a low capacity threshold, a low capacity condition is activated for the node. If the counter fails to meet the low capacity threshold, the value of the counter is stored for subsequent use during the next evaluation of the energy storage device.

13 Claims, 5 Drawing Sheets

(56) References Cited

U.S. PATENT DOCUMENTS

| | | | |
|---|---|---|---|
| 2006/0104291 A1 | 5/2006 | Rodriguez et al. | |
| 2009/0174361 A1 | 7/2009 | Duron et al. | |
| 2010/0134257 A1 | 6/2010 | Puleston et al. | |
| 2010/0142509 A1 | 6/2010 | Zhu et al. | |
| 2011/0202185 A1* | 8/2011 | Imes | H04L 43/08 700/277 |
| 2011/0227414 A1 | 9/2011 | Fischer | |
| 2012/0161721 A1 | 6/2012 | Neethimanickam et al. | |
| 2013/0041607 A1 | 2/2013 | Zimmerman et al. | |
| 2013/0137455 A1 | 5/2013 | Xia et al. | |
| 2013/0147490 A1 | 6/2013 | Lindegger et al. | |
| 2013/0234536 A1 | 9/2013 | Chemishkian et al. | |
| 2013/0257360 A1 | 10/2013 | Singh et al. | |
| 2014/0004912 A1 | 1/2014 | Rajakarunanayake | |
| 2014/0059360 A1* | 2/2014 | Guthrie | G06F 1/30 713/300 |
| 2014/0111032 A1 | 4/2014 | Shearer et al. | |
| 2014/0157034 A1* | 6/2014 | Chiueh | H01M 10/42 713/340 |
| 2014/0159647 A1 | 6/2014 | Nishioka et al. | |
| 2014/0370830 A1 | 12/2014 | Steer | |
| 2015/0309095 A1* | 10/2015 | Monnerie | G01R 21/133 702/60 |
| 2015/0369870 A1 | 12/2015 | Okada et al. | |
| 2015/0380973 A1 | 12/2015 | Scheb | |
| 2016/0116544 A1* | 4/2016 | Li | G01R 31/3624 324/427 |
| 2016/0266979 A1* | 9/2016 | Glover | G06F 9/30083 |

OTHER PUBLICATIONS

Kang et al., "IEEE 802.15-08-409-04-004e; Time Slotted, Channel Hopping MAC Proposal", Jul. 2008, 33 pages.

Ostaffe, "RF-based Wireless Charging and Energy Harvesting Enables New Applications and Improves Product Design", mouser. com; Applications & Technologies, at least as early as Mar. 28, 2014, 2 pages.

Publitek Marketing Communication, "Tune In, Charge Up: RF Energy Harvesting Shows Its Potential", Digi-Key Electronics, May 29, 2013, 5 pages.

* cited by examiner

TECHNIQUES TO PROVIDE A LOW CAPACITY NOTIFICATION FOR AN ENERGY STORE DEVICE

BACKGROUND

Numerous utility meters, such as gas and water meters, are deployed that include battery-powered communication modules. The batteries in these meters may vary in usable life, but may last for up to 20 years. This is primarily achieved through the use of efficient energy-storage batteries, as well as by minimizing the power consumption of the communications module (radio). In order to minimize power consumption, the radio may spend most of its time in a low-power "sleep" mode, waking up on some periodic basis to communicate any data with its network and then returning to sleep.

Promptly replacing exhausted batteries in numerous such devices deployed in operation is a time-consuming and difficult task. Increasing the accuracy and the amount of advance notice given in predicting a low capacity condition for the batteries in these metering devices can produce significant savings in time and money for utility operators by reducing downtime and allowing for efficient scheduling of battery replacement.

SUMMARY

Various aspects of the present invention relate to providing a low capacity notification for an energy storage device, such as a battery, in a node. To this end, the voltage for the battery of the node is measured multiple times according to certain measurement criteria. The measurement criteria may include, for example, a minimum amount of time since the last measurement, a minimum and/or maximum number of measurements that should occur within a time period, etc. In other implementations, a series of voltage measurements may be taken and used rather than a single voltage measurement.

A counter for the node is adjusted based on the measured voltage, where the counter represents an accumulation of results from previous measurements of the voltage with respect to the voltage limit. The counter is adjusted in one direction if the measured voltage is below the voltage limit and the counter is adjusted in an opposite direction if the measured voltage meets the voltage limit. After adjusting the counter, it is determined whether the value of the counter meets a predetermined low capacity threshold. If the counter meets the low capacity threshold, the low capacity condition for the node is activated. Alternatively, if the counter does not meet the low capacity threshold, the counter is stored.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Disclosed herein are techniques for reliably predicting when an energy storage device for a node, such as a utility meter, has reached a predefined low capacity condition, such that replacement of the energy storage device can be scheduled prior to exhausting the remaining capacity. As a consequence of a determination that a battery or other energy storage device has reached the low capacity condition, the node may send a notification to the monitoring system via the network, as well as possibly activating or deactivating an indicator on the node itself. For example, the node may have an LED indicator that turns on or off to indicate the low capacity condition. The notification sent to the monitoring system serves to let the utility operators know that the battery for the node is ready for replacement.

As defined herein, a "node" includes an intelligent device capable of performing functions related to distributing messages in a mesh network. In one system, a node can be a meter located at a facility, such as a house or apartment, which measures the consumption of a utility such as gas, water, or electric power. Such a meter can be part of an RF network used for AMI. Other examples of nodes include a router, collector or collection point, host computer, hub, or other electronic device that is attached to a network and is capable of sending, receiving, or forwarding information over a communications channel.

A node can contain several components that enable it to function within implementations of the present invention. For example, a node can include a radio that can enable it to communicate with like nodes and/or other devices in the mesh network. The radio of each node may be in communication with a microcontroller or other processor that can enable the node to function like a computer, carrying out computer and command functions to provide implementations of the present invention described herein. A node may also include a storage medium for storing information related to communication with other nodes. Such storage mediums can include a memory, a floppy disk, CD-ROM, DVD, or other storage devices located internal to the node or accessible by the node via a network, for example. A node may also include a crystal oscillator (i.e. a clock) to provide time-keeping and an energy storage device (e.g. a battery) to provide back-up power. Some nodes may be powered only by an energy storage device. In the following discussion, a general description of the system and its components is provided, followed by a discussion of the operation of the same.

As defined herein, a "network" or "data network" is used to refer to a group of devices interconnected by communication channels that allow sharing of resources and information. A communication channel can include any suitable means for communicating data over a network, such as (but not limited to) a copper cable, a fiber optic cable, a wireless transmission, power line communication, etc.

As defined herein, a "mesh network" is used to refer to a data network in which each node may be configured for transmitting and receiving data used by the node as well as for relaying data used by other nodes in order to propagate the data via the data network.

As defined herein, a "preamble" is used to refer to supplemental data included with payload data that can identify one or more characteristics of the payload data and/or one or more characteristics associated the transmission of the payload data via a network.

Figure 1:
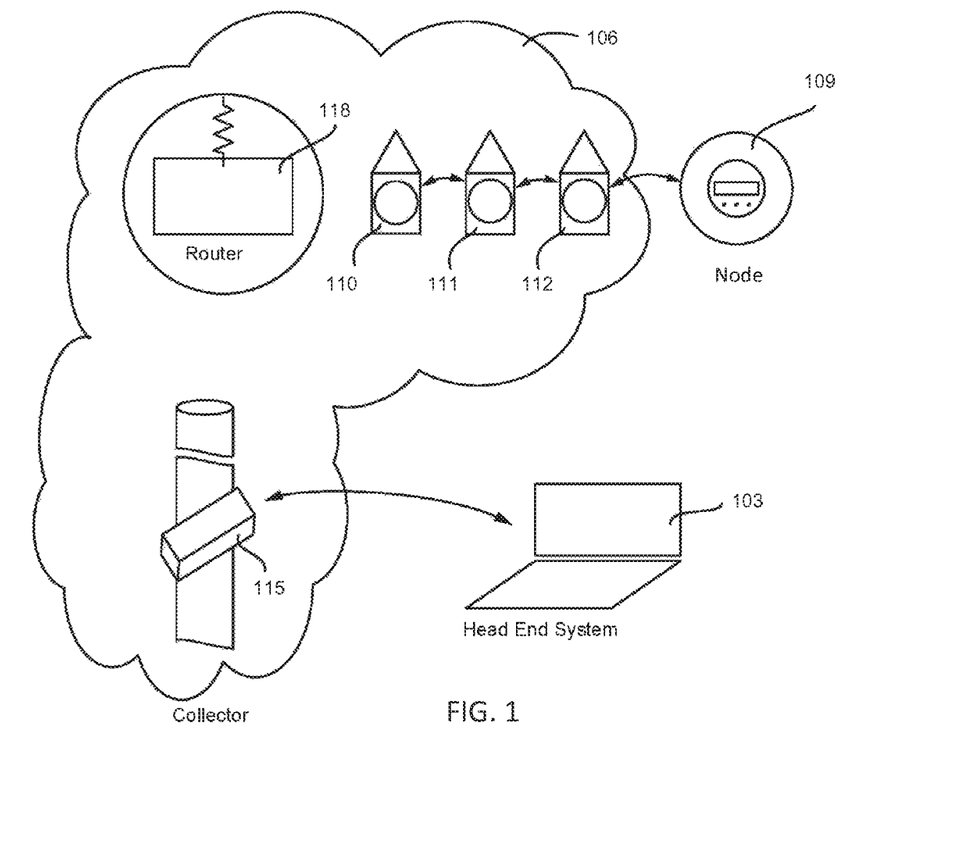
FIG. 1 is a drawing of a networked environment according to various aspects of the present disclosure.

With reference to FIG. 1, shown is an exemplary illustration of a mesh network that may be employed as part of an AMI or other metering network. The head-end system 103 controls the metering network by communicating through the network 106. The network 106 that the head-end system 103 may utilize to communicate to a node 109 may include devices such as other nodes 110-112, collectors 115, routers 118, and possibly other devices. The nodes 109-112 may communicate using one-way and/or two-way communications utilizing any appropriate protocol and any appropriate network configuration. Protocols used by the network 106 include, but are not limited to the IEEE 802.15.4, PRIME, G3, and/or TCP/IP protocols. Several nodes 109-112 may transmit data to a router 118. The router 118, in turn, may route data to a collector 115 in the network 106. A collector may receive data from multiple routers. The collector 115 communicates with the head-end system 103. The head-end system may receive and send information to multiple collectors.

The nodes, such as the node 109, may be meters that are usually in geographically dispersed locations such as homes or businesses. The meters are used to monitor a utility resource such as electricity, water, or natural gas and to measure the usage of the resource. Some meters may be smart meters that support a variety of service commands. These service commands may allow utilities to disconnect, or limit service remotely or manually at the meter. In addition, some meters may store an event log that contains entries of functions the meter has performed. Service commands may originate from the head-end system 103 and are sent via the network 106 to nodes 109-112.

To support functionality and continuous operation of a meter, the node 109 may include an energy storage device (e.g. a battery, supercapacitor, capacitor, etc.) either as a supplemental/backup power source or as a sole power source. For simplicity, throughout the disclosure a battery may be used as a representative energy storage device, though other types of energy storage devices instead of or in addition to batteries are possible as can be appreciated. While the batteries in these meters may be designed for life spans of 15-20 years, eventually all of the batteries will fail and need to be replaced. Promptly replacing the batteries once they are exhausted can be a time-consuming and difficult task, especially when the metering devices in which they are used are deployed in operation across various locations. Increasing the accuracy and the amount of advance notice given in accurately predicting low battery conditions in these metering devices can produce significant savings in time and money for utility operators by reducing downtime and allowing for efficient scheduling of battery replacement.

However, accurately predicting the ideal time period for replacement of a battery based on the time the battery is placed into service is difficult since the life spans of the batteries can vary considerably. Even among seemingly identical batteries, the life spans may differ due to various factors such as environmental conditions, variations in manufacturing, demands during operation, etc. In addition, a single measurement of the battery voltage can be inaccurate for predicting the ideal time period for replacement of a battery due to variations in the voltage during the normal course of operation of a node. For example, temporary drops in the voltage (i.e. "voltage droop") can occur during periods of high current usage, low temperature, and/or other possible factors. Typically, older batteries experience greater drops in the voltage during these periods than do newer batteries. As a result, accurately predicting when the capacity of a battery will fall below an acceptable level is difficult.

The techniques disclosed herein reliably predict when the lifespan of an energy storage device for a node, such as the node 109, has reached a predefined low capacity condition. As a consequence of a determination that a battery or other energy storage device has reached a low capacity (or "low battery") condition, the node may send a notification to the head end system 103 and possibly other devices via the network 106, as well as possibly activating or deactivating an indicator on the node 109 itself. The notification sent to the head end system 103 serves to let the utility operators know that the battery for the node 109 is ready to be replaced.

The battery in a node may be evaluated through use of multiple battery voltage measurements, whereby a counter (also referred to herein as the under voltage counter) is used to provide an accumulated view of the past results of the voltage measurements with respect to a minimum voltage limit. For example, the counter may be incremented each time the measured voltage of the battery in a node is below the minimum voltage limit and decremented each time the measured voltage meets or exceeds the voltage limit. Once the under voltage counter reaches a predefined threshold number of "failing" voltage measurements in excess of any "passing" voltage measurements, a low capacity condition may be declared for the node. The precise value for the threshold at which a low capacity condition is to be declared should be based upon the number of voltage measurements to be taken within a time period, the particular type of node and energy storage device, the amount of advance notice desired (e.g. one month notice prior to the expected exhaustion of the battery), and/or other possible factors.

Through use of multiple battery voltage measurements taken at varying times and the accumulated results expressed by the under voltage counter, the determination that a battery has reached a low capacity condition is less likely to be susceptible to transient fluctuations in the measured battery voltage that can occur during periods of high current use, low temperature, etc. As a result, the low capacity condition for a battery or other energy storage device can be accurately predicted such that the battery can be replaced at the appropriate time, i.e., before the voltage level drops below an acceptable level, but not while the battery has sufficient capacity.

As can be appreciated, throughout this disclosure the particular "direction" of an adjustment to a counter value (i.e. increment or decrement) based on a result may be reversed from the examples given through use of appropriate starting and threshold values for the counter. For example, in implementations of these techniques, the counter value may instead be decremented each time the measured voltage is below the minimum voltage limit and incremented each time the measured voltage meets or exceeds the voltage limit, so long as the starting value of the counter and the threshold value are chosen to accommodate the behavior.

In some implementations, various measurement criteria may need to be satisfied prior to taking a voltage measurement. For example, the measurement criteria may include a minimum amount of time since the last measurement, a minimum and/or maximum number of measurements that should occur within a time period, one or more scheduled measurement intervals in which measurements may be taken, one or more events or activities of activities of the node during which a measurement may or may not be taken, and/or other possible criteria as can be appreciated. The measurement criteria may be used to ensure stability of the measurements through varying degrees of diversity or uniformity of the voltage measurements taken according to various characteristics of the node.

For example, the measurement criteria may specify that a maximum of ten voltage measurements should be taken per day, with at least one hour separating each measurement, and the measurements should occur while the node is transmitting data. Using this exemplary criteria, if the current status of a node satisfies all of the specified criteria, the node may then take or use a measurement of the voltage of the battery to evaluate capacity. Otherwise, the measurement is postponed until the conditions satisfy the specified criteria.

In some implementations, instead of a single voltage measurement, a series of "qualification measurements" are taken. To this end, a qualification measurement of the voltage may be taken and compared to a minimum voltage limit. If the qualification measurement fails to meet the minimum voltage limit, a qualification counter may be incremented. One or more other qualification measurements are taken, typically in quick succession within a brief time period, whereby a qualification counter is incremented each time a failure to meet the voltage limit occurs. Once a predefined number of qualification measurements have occurred, the qualification counter is compared to a qualification threshold. If the qualification counter exceeds the threshold (i.e. the qualification measurements failed to meet the voltage limit a given number of times), the under voltage counter may be incremented by one. However, if the qualification counter is below the threshold (i.e. the qualification measurements met the voltage limit a given number of times), the under voltage counter may be decremented by one. Qualification measurements may be taken in order to improve the voltage measurement accuracy above what may be provided by a single voltage measurement.

For example, the measurement criteria may specify that the voltage measurement should use a series of four qualification measurements that occur during transmission of preamble data to the network 106, and the qualification counter threshold is 50%. That is, if 50% or more of the qualification measurements (2 or more in this example) fail to meet or exceed the voltage limit, the under voltage counter should be incremented once, but if less than 50% of the qualification measurements (0 or 1 in this example) fail to meet or exceed the voltage threshold, then the under voltage counter should be decremented once.

Figure 2:
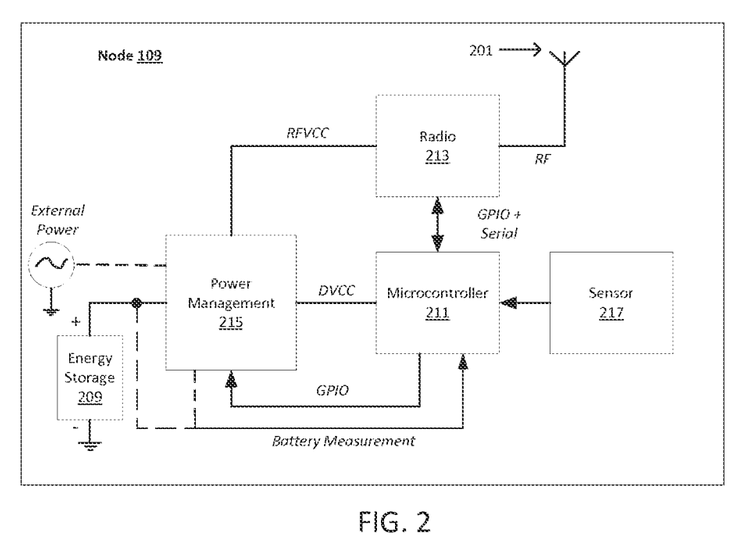
FIG. 2 is a block diagram of an illustrative example of a node in the networked environment of FIG. 1 according to various aspects of the present disclosure.

Referring next to FIG. 2, shown is a block diagram of an illustrative implementation of the node 109 which implements the techniques related to forecasting a low capacity state in an energy storage device of a node. The node 109 includes one or more antennas, represented by the antenna 201, which may be used to transmit and receive communications for the node 109. The design of the antenna 201 may be affected by the RF band(s) at which the node communicates in a network 106 and the RF band(s) at which the node will capture RF emissions. For example, the antenna 201 may include an antenna for the unlicensed 900 MHz industrial, scientific and medical (ISM) bands, in addition to another antenna used for the 1.8-1.9 GHz RF bands.

The energy storage device 209 represents one or more energy storage devices such as a battery, capacitor, supercapacitor, and/or other electrical energy storage devices. In the implementation shown in FIG. 2, the energy storage device 209 is the only source of power for the node 109, though other configurations that use an external power source in conjunction with a local energy storage device are possible.

A microcontroller 211 is responsible for managing the operation and data communications of the node 109. To this end, the microcontroller 211 manages the radio 213, the power management 215, sensor 217, and other possible components of the node 109 not shown herein. The radio 213 facilitates transmission and reception of data to and from the antenna 201.

The various components of the node 109 may receive electrical power from the energy storage device 209 and potentially an external power source, such as the AC power source shown. The electrical power from the energy storage device 209 and any other power sources may be adjusted by the power management 215 in order to accommodate the electrical needs of disparate electrical components. For example, the power management 215 may perform voltage regulation, voltage step-up/down conversion, power output on/off switching, single input to multi-outputs conversion, current limiting, and/or other possible power operations as can be appreciated. In some implementations, the microcontroller 211 may include or be in communication with the sensor 217 for measuring the input voltage ultimately supplied by the energy storage device 209. In some variations, the measurement may be a binary determination of whether the voltage meets or fails to meet a minimum voltage limit. In other variations, the measurement may be a numerical measurement of the voltage. For example, some nodes may use a low voltage detect feature available with the microcontroller to detect low battery voltage, while other nodes may measure the voltage supplied by the energy storage device to an input of the microcontroller.

In addition, the power management 215 may act as a switch managed by the microcontroller 211 to enable and disable power to certain components of the node 109, such as the radio 213. For example, power to the radio 213 may be switched off while the node is in a low-power "sleep" mode and switched on when the node is active, when data is to be sent or received, etc.

Figure 3:
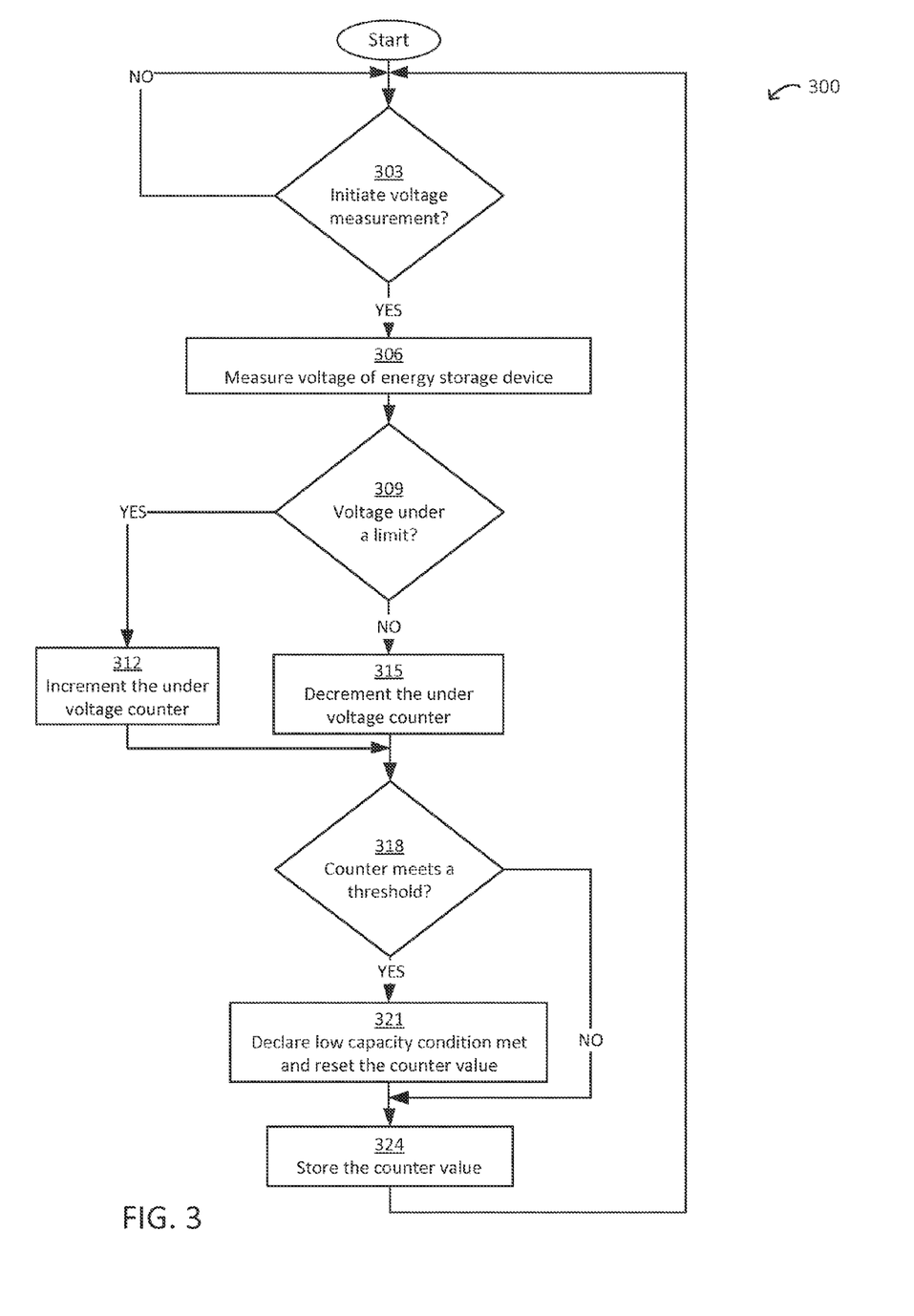
FIG. 3 is a flowchart illustrating one example of early failure warning functionality implemented for an energy storage device in a node in the networked environment of FIG. 1 according to various aspects of the present disclosure.

Referring next to FIG. 3, shown is a flowchart that provides an exemplary implementation of the techniques related to forecasting a low capacity state in an energy storage device of a node, such as the node 109, according to various implementations. It is understood that the flowchart of FIG. 3 provides merely an example of the many different types of functional arrangements that may be employed to implement the early warning operations of the method 300 as described herein. The operations depicted in the flowchart of FIG. 3 illustrate performing the voltage evaluations and determining whether the capacity of an energy storage device has dropped below an acceptable level based upon the accumulated results of the evaluations, both current and previous.

Beginning with block 303, the method 300 determines whether a voltage measurement should be presently taken. In some implementations, various measurement criteria may need to be satisfied prior to taking or using a voltage measurement. For example, the measurement criteria may include a minimum amount of time has elapsed since the last measurement, a minimum and/or maximum number of measurements that should occur within a time period, one or more scheduled measurement intervals in which measurements may be taken, one or more events or activities of activities of the node during which a measurement may or may not be taken, and/or other possible criteria as can be appreciated. The measurement criteria may be used to ensure stability of the voltage measurements taken according to various characteristics of the node.

For example, operational observations may indicate that voltage measurements are more accurate if taken while a node is performing a particular activity, such as during a data transmission. As a result, the measurement criteria for the node may be configured to take voltage measurements during data transmissions by the node, where, in this example, logic in the node performs data transmissions 10 times over the course of each 24-hour period. In order to compensate for temperature fluctuations that occur during each day, such as lower voltage measurements during cooler times of the day, the node may be configured with a low capacity threshold that is also 10 based upon the number of measurements to be taken in a full 24-hour period. A low capacity threshold that is lower than the expected number of measurements taken each day may be more susceptible to variations, such as daily temperature fluctuations, while a low capacity threshold that is longer than the expected number of measurements taken each day may provide less advance notice of diminished capacity in the energy storage device of the node. However, the low capacity threshold and the various measurement criteria may be configured and reconfigured based on various factors such as the particular type of node and energy storage device, environmental conditions during operation, the amount of advance notice desired (e.g. one month notice prior to the expected exhaustion of the battery), and/or other possible factors.

For forecasting purposes, the following equation may be used to approximately predict the number of days until a low capacity condition is reached for a node, assuming a fixed ratio of pass/fail voltage measurements that are randomly distributed:

$$T=S/(2*(M/N)-1)$$

where:
T=the number of days before the low capacity threshold is met
S=the low capacity threshold expressed in days of voltage measurements
N=the number of voltage measurement to be taken per day
M=the expected number of failing voltage measurements per day Using the above equation for the previous example, N=10 since the number of expected measurements each day is 10, and S=1 indicating that the low capacity threshold is equal to the number of measurements to be taken in only one day. To determine the estimated number of days to reach a low capacity condition if, for instance, six of the 10 daily voltage measurements fail to meet the voltage limit, M=6. Inserting these values into the equation provides:

$$T=1/(2*(6/10)-1)$$

Solving the equation, T=5, thereby indicating that it is expected to take five days to reach the low capacity condition under the above circumstances when the low capacity threshold is equal to the number of measurements taken in one day. It should be noted that the results of the equation represent only an estimate of the number of days to reach a low capacity condition and that the low capacity condition could be reached sooner if the pass/fail results of the voltage measurements are not randomly distributed.

As can be seen, in order for the equation to provide a meaningful result for the number of days before the low capacity threshold is met (T), the number of failing measurements (M) must be greater than 50% of the total number of measurements taken per day (N). Otherwise, values of M/N substituted into the equation that are less than or equal to 50% would indicate that the counter is in a steady-state or moving away from the low capacity threshold since at least half of the voltage measurements would be expected to pass, as indicated by the M/N value. As an illustration, with a fresh battery, it is expected that most of the voltage measurements (i.e. half or more) will meet the minimum voltage limit. As a result, the low capacity threshold is not expected to be reached in the near-term. However, as the battery ages, it is expected that the number of voltage measurements that fail to meet the minimum voltage limit will increase and eventually reach more than 50%. When more than half of the voltage measurements fail to meet the voltage limit, the counter will gradually move toward the low capacity threshold until the threshold is met. Once the node reaches this point where the failing voltage measurements in the node exceed 50%, the equation can be helpful in predicting the number of subsequent days before the low capacity threshold will be met. In addition, the equation can be useful in determining values of S and N to be configured for a node in order to achieve a desired value for T.

Next, in block 306, the voltage of the energy storage device of the node is measured. In some variations, the measurement may be a binary determination of whether the voltage meets or fails to meet a minimum voltage limit. For example, rather than determining the actual voltage received by the microcontroller, the voltage would simply be determined as meeting or failing to meet a minimum voltage limit, such as 3.45 V. In other variations, the measurement may be a numerical measurement of the voltage, such as 3.2 V.

Then, in block 309, the node determines whether the voltage is under the minimum voltage limit for the node. If the voltage fails to meet the minimum voltage limit, then, in block 312, the under voltage counter is incremented once. Alternatively, if the voltage meets or exceeds the minimum voltage limit, then, in block 315, the under voltage counter is decremented once. As indicated in block 306, in some implementations of a node, a binary determination of the voltage ultimately provided by the energy storage device may already include the determination step described in block 309. In some implementations, the node may implement a "pass limit" in order to avoid accumulating a large number of adjustments in the counter for voltage measurements that meet the voltage limit. For example, when a node is first installed with a new energy storage device, most of the voltage measurements will likely meet the voltage limit. In order to avoid an accumulation of potentially months or years of "passing" adjustments to the counter, the counter may, for example, be initialized at 0 and decrement for a "passing" voltage measurement only if the counter value is 1 or greater.

Subsequently, in block 318, the node determines whether the under voltage counter has reached a predefined threshold number of "failing" voltage measurements in excess of any "passing" voltage measurements (i.e. "passing" meaning measurements that meet or exceed the minimum voltage limit). If the current value of the under voltage counter meets or exceeds this low capacity threshold, in block 321, a low capacity condition may be declared for the node. Once the low capacity condition is declared, the node may transmit a notice to the head end system and/or other devices via the network, deactivate or activate an indicator local to the node, and/or perform other possible actions. In some implementations, further measurements and voltage evaluations may cease after a low capacity condition has been declared by including a check for the condition within the measurement criteria described in block 303. In other implementations, once the low capacity condition is declared, this portion of the execution of the method 300 may end.

Returning to block 318, if the low capacity threshold has not yet been met, then execution of the method 300 in the node proceeds to block 324. In block 324, the node stores the current value of the under voltage counter for use in future evaluations of the counter described in block 318. Thereafter, execution of the method 300 in the node may return to block 303.

Figure 4:
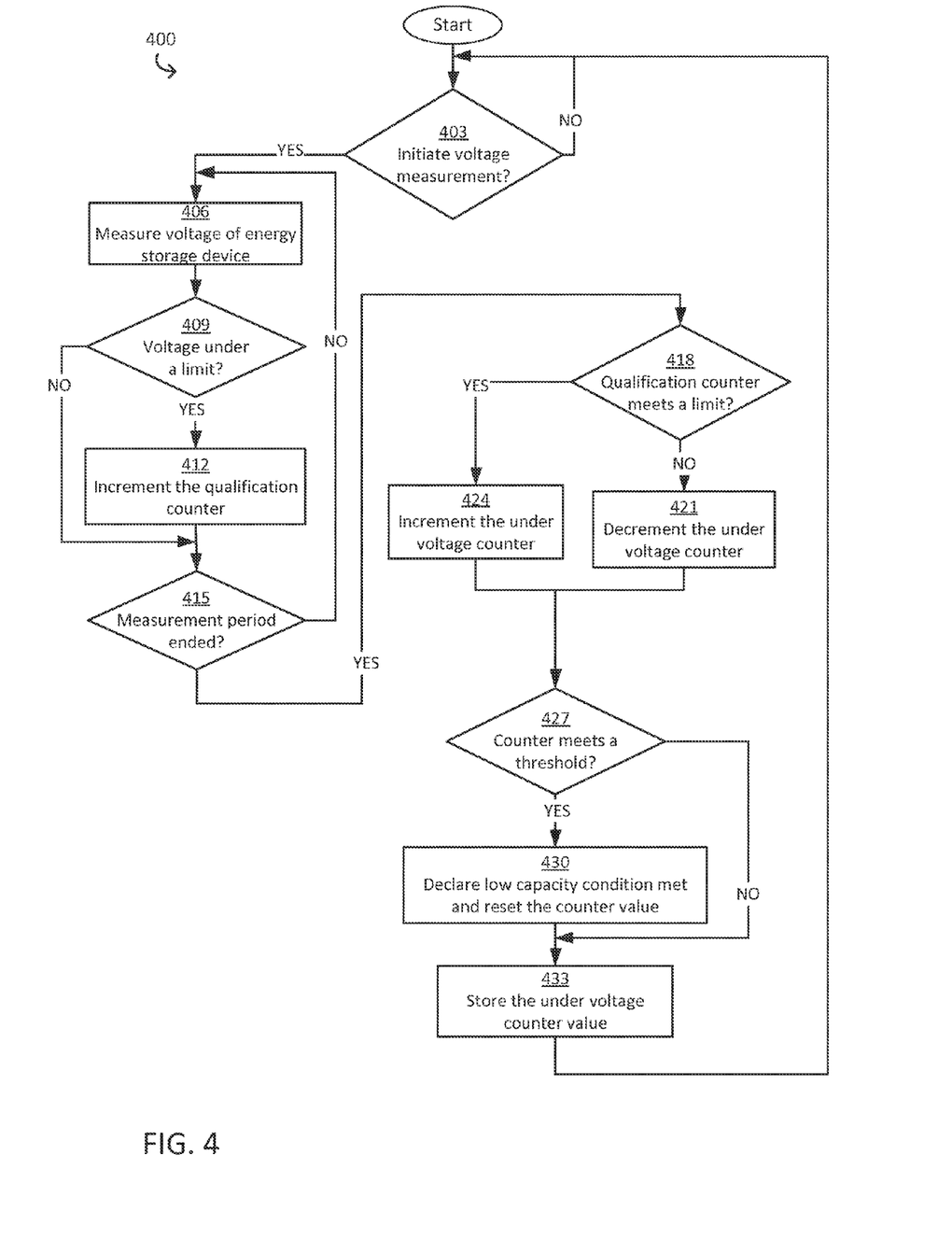
FIG. 4 is a flowchart illustrating another example of early failure warning functionality implemented for an energy storage device in a node in the networked environment of FIG. 1 according to various aspects of the present disclosure.

Referring next to FIG. 4, shown is a flowchart that provides another example of an implementation of the techniques related to forecasting a low capacity state in an energy storage device of a node, such as the node 109, according to various implementations. It is understood that the flowchart of FIG. 4 provides merely an example of the many different types of functional arrangements that may be employed to implement the early warning operations of the method 400 as described herein. The operations depicted in the flowchart of FIG. 4 illustrate performing the voltage evaluations that include qualification measurements of the voltage and determining whether an energy storage device has entered the low capacity condition based upon the accumulated results of the evaluations, both current and previous.

Beginning with block 403, the method 400 determines whether a voltage measurement should be presently taken. In some implementations, various measurement criteria may need to be satisfied prior to taking a voltage measurement. For example, the measurement criteria may include a minimum amount of time since the last series of qualification measurements, a minimum and/or maximum number of measurements that should occur within a time period, one or more scheduled measurement intervals in which measurements may be taken, one or more events or activities of activities of the node during which a measurement may or may not be taken, and/or other possible criteria as can be appreciated. The measurement criteria may be used to ensure stability of the voltage measurements taken according to various characteristics of the node. In some implementations, the measurement criteria may also be used to specify that the voltage measurement information used to adjust the under voltage counter should be based on multiple qualification measurements rather than a single voltage measurement. If the current status of a node satisfies all of the specified criteria, the method may proceed to block 406. Otherwise, measurement is postponed until the conditions satisfy the specified criteria and execution of the method 400 returns to block 403.

Next, in block 406, the voltage of the energy storage device of the node is measured. In some variations, the measurement may be a binary determination of whether the voltage meets or fails to meet a minimum voltage limit. In other variations, the measurement may be a numerical measurement of the voltage, such as 3.2 V.

Then, in block 409, the node determines whether the voltage is under the minimum voltage limit for the node. If the voltage fails to meet the minimum voltage limit, then, in block 412, the qualification counter is incremented once. Alternatively, if the voltage meets or exceeds the minimum voltage limit, then no adjustment is made to the qualification counter and execution of the method 400 in the node skips to block 415. As indicated in block 406, in some implementations of a node, a binary determination of the voltage ultimately provided by the energy storage device may already include the determination step described in block 409.

Next, in block 415, the node determines whether the qualification measurement period has ended. The qualification measurement period may be determined based on an amount of time, a number of qualification measurements performed, durations of operations being performed by the node (e.g. measure during transmission of the preamble), etc. If the measurement period has not ended, execution of the method 400 in the node returns to block 406. Alternatively, execution of the method 400 proceeds to block 418.

Subsequently, in block 418, the node determines whether the qualification counter meets or exceeds a qualification limit. If the qualification counter is below the qualification limit (i.e. meaning a sufficient number of qualification measurements of the voltage were at or above the voltage limit), then, in block 421, the under voltage counter is decremented once. Alternatively, if the qualification counter meets or exceeds the qualification limit (i.e. meaning too few of the qualification measurements of the voltage were at or above the voltage limit), then, in block 421, the under voltage counter is incremented once.

Then, in block 427, the node determines whether the under voltage counter reaches a predefined threshold number of "failing" voltage measurements in excess of any "passing" voltage measurements (i.e. "passing" meaning measurements that meet or exceed the minimum voltage limit). If the current value of the under voltage counter meets or exceeds this low capacity threshold, in block 430, a low capacity condition may be declared for the node. Once the low capacity condition is declared, the node may transmit a notice to the head end system and/or other devices via the network, deactivate or activate an indicator local to the node, and/or perform other possible actions. In some implementations, further measurements and voltage evaluations may cease after a low capacity condition has been declared by including a check for the condition within the measurement criteria described in block 403. In other implementations, once the low capacity condition is declared, this portion of the execution of the method 400 may end.

Returning to block 427, if the low capacity threshold has not yet been met by the under voltage counter, then execution of the method 400 in the node proceeds to block 433. In block 433, the node stores the current value of the under voltage counter for use in future evaluations of the counter described in block 427. Thereafter, execution of the method 400 in the node may return to block 403.

Figure 5:
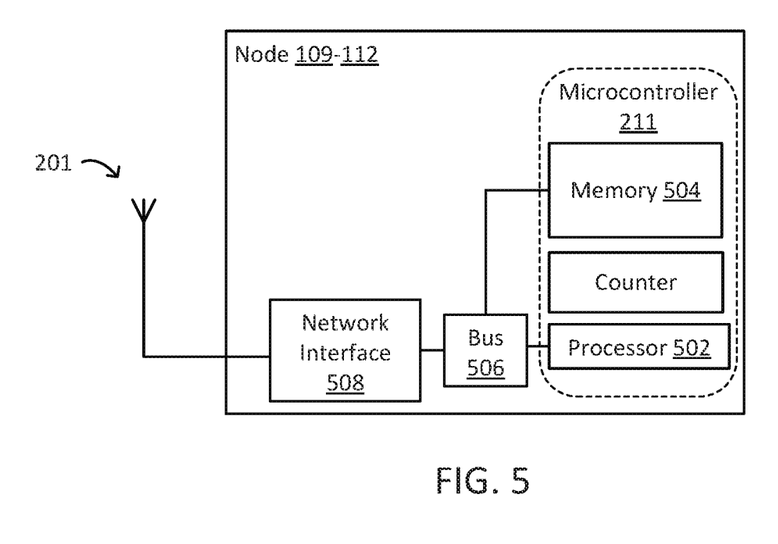
FIG. 5 is a block diagram that provides another example illustration of a node employed in the networked environment of FIG. 1 according to various aspects of the present disclosure.

Next, in FIG. 5, shown is another block diagram depicting an example of a node 109-112 used for implementing the techniques disclosed herein. The node 109-112 can include a processing device 502. Non-limiting examples of the processing device 502 include a microprocessor, an application-specific integrated circuit ("ASIC"), a state machine, or other suitable processing device. The processing device 502 can include any number of processing devices, including one. The processing device 502 can be communicatively coupled to computer-readable media, such as memory device 504. The processing device 502 can execute computer-executable program instructions and/or access information respectively stored in the memory device 504. In some implementations, the processor 502 and memory 504 may be incorporated as components of a microcontroller, such as the microcontroller 211.

The memory device 504 can store instructions that, when executed by the processing device 502, cause the processing device 502 to perform operations described herein. The memory device 504 may be a computer-readable medium such as (but not limited to) an electronic, optical, magnetic, or other storage device capable of providing a processor with computer-readable instructions. Non-limiting examples of such optical, magnetic, or other storage devices include read-only ("ROM") device(s), random-access memory ("RAM") device(s), magnetic disk(s), magnetic tape(s) or other magnetic storage, memory chip(s), an ASIC, configured processor(s), optical storage device(s), or any other medium from which a computer processor can read instructions. The instructions may comprise processor-specific instructions generated by a compiler and/or an interpreter from code written in any suitable computer-programming language. Non-limiting examples of suitable computer-programming languages include C, C++, C#, Visual Basic, Java, Python, Perl, JavaScript, and the like.

The nodes 109-112 can include a bus 506 that can communicatively couple one or more components of the node 109-112. Although the processor 502, the memory 504, and the bus 506 are depicted in FIG. 5 as separate components in communication with one another, other implementations are possible. For example, the processor 502, the memory 504, and the bus 506 can be components of printed circuit boards or other suitable devices that can be disposed in a node 109-112 to store and execute programming code.

The nodes 109-112 can also include a network interface device 508, such as may be implemented by the radio 213. The network interface device 508 can be a transceiving device configured to establish one or more of the wireless communication links via an antenna 201. A non-limiting example of the network interface device 508 is an RF transceiver and can include one or more components for establishing a communication links to other nodes 109-112 in the mesh network 106.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other storage devices, transmission devices, or display devices of the computing platform.

The system or systems discussed herein are not limited to any particular hardware architecture or configuration. A computing device can include any suitable arrangement of components that provide a result conditioned on one or more function calls. Suitable computing devices include multi-purpose microprocessor-based computer systems accessing stored software that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation, and does not preclude inclusion of such modifications, variations, and/or additions to the present subject matter as would be readily apparent to one of ordinary skill in the art.

Therefore, the following is claimed:

1. A method for determining a low capacity condition for an energy storage device of a node in a network, comprising:
   determining whether to initiate a voltage measurement for the energy storage device based on measurement criteria that specifies a maximum number of voltage measurements within a time period; and
   when a number of voltage measurements taken is within the maximum number of voltage measurements within the time period:
      measuring a voltage for the energy storage device during transmission of data to the network;
      after measuring the voltage for the energy storage device, adjusting a counter for the node based on the measured voltage, wherein (i) the counter is adjusted in one direction when the measured voltage is below a voltage limit, and (ii) the counter is adjusted in an opposite direction when the measured voltage meets the voltage limit;

comparing the counter to a low capacity threshold, wherein the low capacity threshold corresponds to a predetermined number of measurements below the voltage limit in excess of a number of measurements that meet the voltage limit;

when the counter meets the low capacity threshold:
determining that the low capacity condition for the energy storage device exists; and
transmitting, via the network, a notification for the low capacity condition of the node; and when the counter is below the low capacity threshold, storing a value of the counter for use with a next voltage measurement.

2. The method of claim 1, wherein the measurement criteria further specifies that the voltage measurement is initiated during one or more activities of the node.

3. The method of claim 2, wherein the one or more activities includes transmission of preamble data via the network.

4. The method of claim 1, wherein the node is a utility meter deployed as part of an advanced metering infrastructure (AMI) system.

5. The method of claim 1, wherein at least one of (i) the low capacity threshold and (ii) the maximum number of voltage measurements within the time period are configurable.

6. The method of claim 1, wherein said measuring the voltage comprises taking a plurality of qualification measurements of the voltage of the energy storage device, wherein said adjusting the counter comprises (i) adjusting the counter once in the one direction when a threshold number of the qualification measurements are below the voltage limit, and (ii) adjusting the counter once in the opposite direction when the threshold number of the qualification measurements meets or exceeds the voltage limit.

7. The method of claim 1, wherein the counter includes a pass limit such that said adjusting the counter in the opposite direction occurs when (i) the measured voltage meets or exceeds the voltage limit, and (ii) the counter does not meet the pass limit.

8. The method of claim 1, further comprising activating or deactivating an indicator on the node in response to the low capacity condition of the node.

9. A non-transitory computer-readable medium embodying a program executable by a processor of a node in a network, comprising code for:

determining whether to initiate a voltage measurement for an energy storage device of the node based on measurement criteria that specifies a maximum number of voltage measurements within a time period; and when a number of voltage measurements taken is within the maximum number of voltage measurements within the time period:

measuring a voltage for the energy storage device during transmission of data to the network;

after measuring the voltage for the energy storage device, adjusting a counter for the node based on the measured voltage, wherein (i) the counter is adjusted in one direction when the measured voltage is below a voltage limit, and (ii) the counter is adjusted in an opposite direction when the measured voltage meets the voltage limit; and comparing the counter to a low capacity threshold, wherein the low capacity threshold corresponds to a predetermined number of measurements below the voltage limit in excess of a number of measurements that meet the voltage limit;

when the counter meets the low capacity threshold:
determining that a low capacity condition for the energy storage device exists; and
transmitting, via the network, a notification for the low capacity condition of the node; and when the counter is below the low capacity threshold, storing a value of the counter for use with a next voltage measurement.

10. The non-transitory computer-readable medium of claim 9, wherein the counter includes a pass limit such that said adjusting the counter in the opposite direction occurs when (i) the measured voltage meets the voltage limit, and (ii) the counter does not meet the pass limit.

11. The non-transitory computer-readable medium of claim 9, wherein the measurement criteria further comprises at least one of: a minimum amount of time since the previous measurement of the voltage, a minimum number of measurements within a time period, and one or more scheduled measurement intervals.

12. The non-transitory computer-readable medium of claim 9, wherein the node is a utility meter deployed as part of an advanced metering infrastructure (AMI) system.

13. The non-transitory computer-readable medium of claim 9, wherein said measuring the voltage comprises a plurality of qualification measurements of the voltage of the energy storage device within a time interval, said adjusting the counter comprises (i) adjusting the counter once in the one direction when a threshold number of the qualification measurements are below the voltage limit, and (ii) adjusting the counter once in the opposite direction when the threshold number of the qualification measurements meet the voltage limit.

* * * * *

UNITED STATES PATENT AND TRADEMARK OFFICE
CERTIFICATE OF CORRECTION

PATENT NO. : 9,851,410 B2
APPLICATION NO. : 14/551433
DATED : December 26, 2017
INVENTOR(S) : Tou Lee and Raghav Goteti It is certified that error appears in the above-identified patent and that said Letters Patent is hereby corrected as shown below:

On the Title Page

Under Item (54) Title:
"Techniques to Provide a Low Capacity Notification For An Energy Store Device," should be corrected to read --Techniques to Provide a Low Capacity Notification For an Energy Storage Device--.

Signed and Sealed this
Twelfth Day of June, 2018

Andrei Iancu
*Director of the United States Patent and Trademark Office*